(12) United States Patent
Hidaka et al.

(10) Patent No.: US 11,314,073 B2
(45) Date of Patent: Apr. 26, 2022

(54) LIGHTING DEVICE AND INSPECTION APPARATUS HAVING THE SAME

(71) Applicant: SAMSUNG ELECTRONICS CO., LTD., Suwon-si (KR)

(72) Inventors: Yasuhiro Hidaka, Kanagawa (JP); Masato Kajinami, Kanagawa (JP); Takayuki Sasaoka, Kanagawa (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 351 days.

(21) Appl. No.: 16/547,492

(22) Filed: Aug. 21, 2019

(65) Prior Publication Data

US 2020/0132977 A1 Apr. 30, 2020

(30) Foreign Application Priority Data

Oct. 29, 2018 (JP) ................................. 2018-202969
Dec. 18, 2018 (KR) ........................ 10-2018-0163949

(51) Int. Cl.
*G02B 21/08* (2006.01)
*G02B 21/36* (2006.01)
*G02B 26/06* (2006.01)

(52) U.S. Cl.
CPC .......... *G02B 21/084* (2013.01); *G02B 21/36* (2013.01); *G02B 26/06* (2013.01)

(58) Field of Classification Search
CPC ... G02B 21/082; G02B 21/084; G02B 21/086
See application file for complete search history.

(56) References Cited

U.S. PATENT DOCUMENTS

| 4,873,653 A * | 10/1989 | Grosskopf | G02B 21/00 359/371 |
| 7,443,578 B2 * | 10/2008 | Yamazaki | G02B 21/082 359/627 |
| 7,982,950 B2 * | 7/2011 | Boesser | G01B 11/24 359/368 |
| 9,594,240 B2 * | 3/2017 | Kimura | G02B 21/0016 |
| 9,851,548 B2 * | 12/2017 | Shimura | G02B 21/0016 |

(Continued)

FOREIGN PATENT DOCUMENTS

| JP | 20030156710 A | 5/2003 |
| JP | 20100160307 A | 7/2010 |
| JP | 20100224311 A | 10/2010 |

*Primary Examiner* — Christopher Stanford
(74) *Attorney, Agent, or Firm* — Volentine, Whitt & Francos, PLLC (57) ABSTRACT

A lighting device includes a light source generating a beam of illumination light, a ring-shaped aperture shielding a central portion of the illumination light and transforming the beam of illumination light into ring-shaped illumination light, and an object lens focusing the ring-shaped illumination light such that a specimen can be illuminated with the ring-shaped illumination light. An inspection apparatus including the light device also has a beam splitter and an image sensor picking up light reflected and/or diffracted from the specimen through the beam splitter. Because a central portion of the illumination light is shielded, lens flare of light transmitted by the beam splitter and the object lens is prevented thereby preventing speckles in the image produced by the image sensor.

18 Claims, 10 Drawing Sheets

(56) References Cited

U.S. PATENT DOCUMENTS

2012/0099172 A1* 4/2012 Ohki .................... G02B 21/088
                                                              359/239
2013/0083322 A1* 4/2013 Iketaki .................. G01N 21/65
                                                              356/301

* cited by examiner

| No | RING-SHAPED APERTURE | DIFFUSION PLATE | EVALUATION RESULTS OF SPECKLE REDUCTION | |
|---|---|---|---|---|
| 1 | X | STOP |  | B |
| 2 | X | ROTATION |  | A |
| 3 | O | ROTATION |  | A++ |
| 4 | X | X |  | B |
| 5 | O | X |  | A+ |

INTENSITY OF AN
ILLUMINATION LIGHT
ILLUMINATED ONTO AN
INSPECTION OBJECT

RADIAL POSITION OF THE
RING-SHAPED APERTURE

LIGHTING DEVICE AND INSPECTION APPARATUS HAVING THE SAME

PRIORITY STATEMENT

This application claims priority under 35 U.S.C § 119 to Japan Patent Application No. 2018-202969 filed on Oct. 29, 2018 in the Japan Intellectual Property Office and Korean Patent Application No. 10-2018-0163949 filed on Dec. 18, 2018 in the Korean Intellectual Property Office, the disclosure of which is hereby incorporated by reference in its entirety.

BACKGROUND

1. Field

The present inventive concept relates to a lighting device and an inspection apparatus including the same. More particularly, the inventive concept relates to a lighting device comprising a laser for generating illumination light and an inspection apparatus having such a lighting device for inspecting semiconductor wafers.

2. Description of the Related Art

An inspection apparatus for inspecting semiconductor wafers (referred to as a wafer inspection apparatus) using a high resolution camera and a high magnification lens can detect features of chips on the wafer on a scale of nanometers. Reducing the inspection time has been strongly in demand in the art for improving the production yield of semiconductor devices.

Reducing the inspection time can be usually accomplished by speeding up the stage onto which the wafer is secured and by shortening the scan time of the camera along the wafer. The scan time of the camera is mainly a measure of frames per second (fps) of the camera and thus, a high fps camera has been widely adopted for use in wafer inspection apparatus.

Illumination light of a high intensity is required to be incident on a sensor of the high fps camera if high quality images with high signal-to-noise ratio (SN ratio) are to be produced by the camera. Conventionally, a halogen lamp or a light emitting diode (LED) has been used as a light source to generate illumination light detected by the sensor of the camera. However, the conventional halogen lamp and LED produce illumination light of such small luminance that the high fps camera tends to generate images having a relatively large shot noise.

SUMMARY

According to an example of the inventive concept, there is provided a lighting device including a light source that generates a beam of illumination light along an optical path of the lighting device, a ring-shaped aperture disposed along the optical path such that a central portion of the illumination light is shielded and the illumination light transmitted through the aperture has a ring-shaped cross section in a plane perpendicular to the optical path, and an object lens positioned downstream of the ring-shaped aperture along the optical path so as to focus the illumination light having the ring-shaped cross section on a focal plane, whereby a specimen disposed at the focal plane will be illuminated by the illumination light having the ring-shaped cross section.

According to another example or aspect of the inventive concept, there is provided a an inspection apparatus including a light source that generates a beam of illumination light along an optical path, a ring-shaped aperture disposed along the optical path such that a central portion of the illumination light is shielded and the illumination light transmitted through the aperture has a ring-shaped cross section in a plane perpendicular to the optical path, an object lens positioned downstream of the ring-shaped aperture along the optical path so as to focus the illumination light having the ring-shaped cross section on a focal plane, whereby a peripheral portion of the illumination light generated by the light source will illuminate and reflect from a specimen disposed at the focal plane while a central portion of the illumination light generated by the light source will not be reflected from the specimen, and an image sensor positioned relative to the object lens to receive the peripheral portion of the illumination light reflected from the specimen and operative to generate an image of the specimen from the illumination light reflected from the specimen.

According to another example or aspect of the inventive concept, there is provided a an inspection apparatus including a light source that generates a beam of illumination light along an optical path, a diaphragm disposed along the optical path, the diaphragm including an outer light shield delimiting an outer boundary of an aperture and an inner light shield disposed centrally with respect to the outer boundary of the aperture such that the diaphragm transmits the illumination light through the aperture as a beam with an umbra at a central portion of the beam, an object lens positioned downstream of the aperture along the optical path so as to focus the beam with an umbra at its central portion on a focal plane, whereby a peripheral portion of the beam of illumination light generated by the light source and focused by the object lens will illuminate and reflect from a specimen disposed at the focal plane, and an image sensor positioned relative to the object lens to receive the beam of illumination light reflected from the specimen and operative to generate an image of the specimen from the beam of the illumination light reflected from the specimen.

BRIEF DESCRIPTION OF THE DRAWINGS

These and other features of the inventive concept will become more apparent by referring to examples thereof in detail with reference to the accompanying drawings of which.

DETAILED DESCRIPTION

Examples of the present inventive concept will now be described in detail with reference to the accompanying drawings, wherein like reference numerals designate like components throughout.

Figure 1:
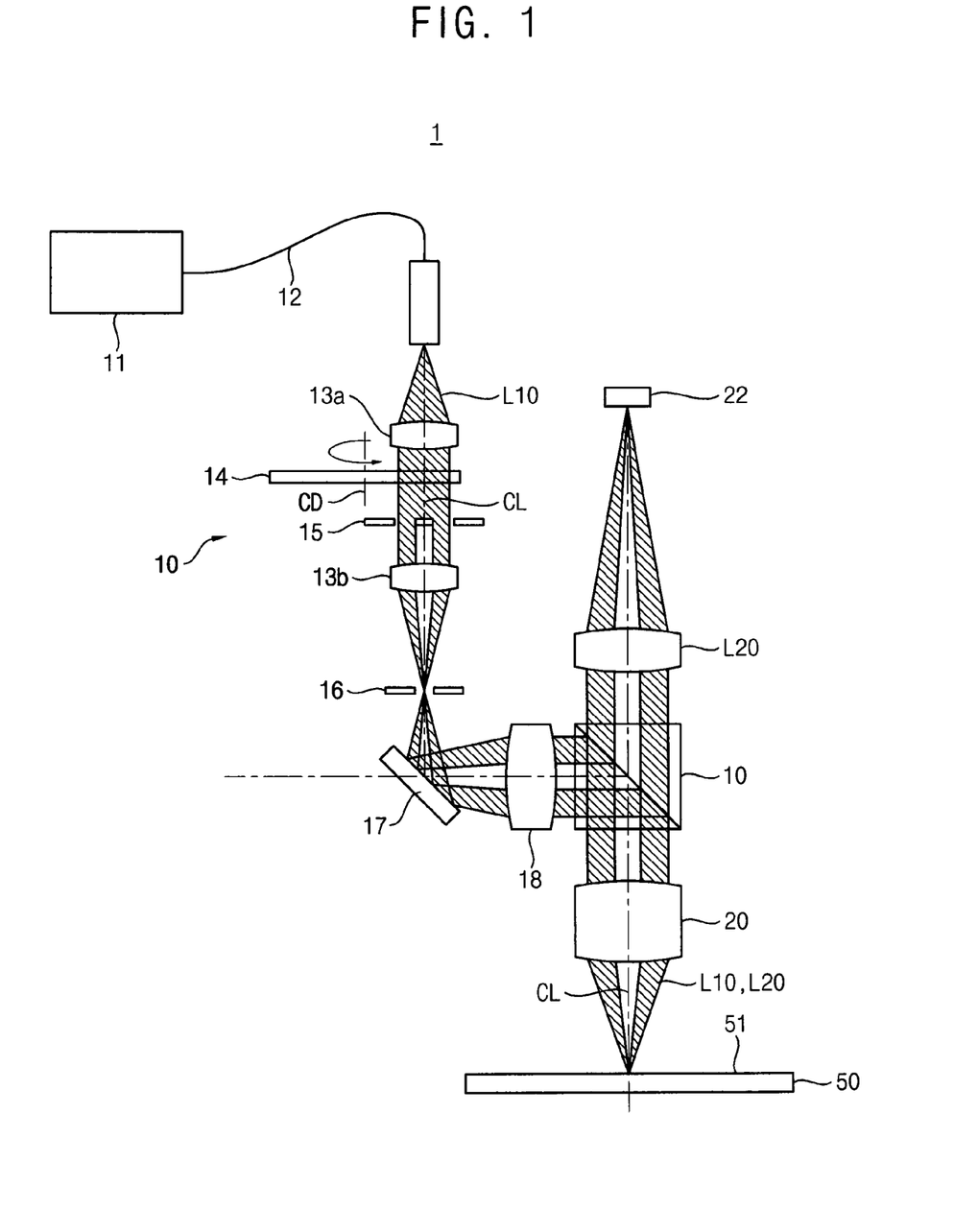
FIG. 1 is a schematic diagram of an example of an inspection apparatus in accordance with the present inventive concept.

FIG. 1 illustrates a first example of an inspection apparatus in accordance with the present inventive concept. In the present example, the inspection apparatus may inspect a semiconductor wafer on which at least a semiconductor process has been conducted.

Referring to FIG. 1, the inspection apparatus 1 may include a lighting device 10 for emitting an illumination light L10 to illuminate a wafer under inspection (WUI) 50. At first, the structure of the lighting device 10 will be described in detail and then the structure and operation of the inspection apparatus 1 will be described in detail hereinafter.

<Structure of the Lighting Device>

As shown in FIG. 1, the lighting device 10 may include a light source 11, an optical fiber 12, a collimator lens 13a, a focus lens 13b, a light phase modulator 14, an aperture-providing diaphragm 15, a field stop 16, a mirror 17, a condenser lens 18, a beam splitter 19 and an object lens 20.

The light source 11 may generate the illumination light L10. For example, the light source 11 may include a laser for generating laser light as the illumination light L10 which is preferable as the luminance of a laser can be relatively high. In the present example, the laser may be a semiconductor laser such as a Fabry-Perot type semiconductor laser.

The optical fiber 12 is connected to the light source 11 and the illumination light L10 generated from the light source 11 may travel in the optical fiber 12 and is emitted from the optical fiber 12 as a divergent beam.

The collimator lens 13a may transform the beam type of the illumination light L10 from a divergent beam into a parallel beam. Then, the parallel beam is transformed into a convergent beam by the focus lens 13b. In the present example, the light generated from the light source 11 for generating the illumination light L10 comprises a laser. Thus, laser light is emitted from the fiber 12 as the divergent laser beam and the divergent laser beam is transformed into a parallel laser beam by the collimator lens 13a. Thereafter, the parallel laser beam is formed into a convergent laser beam by the focus lens 13b.

In an example, the light phase modulator 14 is an optical diffuser having a plate-like form positioned between the collimator lens 13a and the focus lens 13b and may change the phase of the illumination light L10 temporally or spatially, i.e., may impart a time or spatially dependent phase change to the laser light. In the present example, the optical diffuser 14 changes the phase of the illumination light L10 temporally. The optical diffuser 14 may include a rotational axis CD that is parallel with an optical axis CL of the lighting device 10 and may rotate with respect to the rotational axis CD.

When the illumination light L10 passes along the optical axis CL through the rotating optical diffuser 14, the phase of the illumination light L10 is changed temporally or spatially. To this end, the optical diffuser 14 may include a milk-white glass and the phase of the illumination light L10 is randomly changed by the optical diffuser 14. Thus, the period of the phase change of the illumination light L10 is increased, thereby maximizing the scan time of an image sensor (described later on). Thus, the image sensor may generate a low-speckle image.

Although the present example has the optical diffuser 14 positioned between the collimator lens 13a and the focus lens 13b, the optical diffuser 14 (or other appropriate type of light phase modulator) may also be disposed at any other position in the optical path of the illumination light L10. Here, the term "optical path" will refer to the path of all of the optical axes in the inspection apparatus 1 along which light propagates (from the light source to the specimen being inspected and from the specimen to the image sensor). In addition, here too the light phase modulator may change the phase of the divergent beam or the convergent beam of the illumination light L10 temporally or spatially.

The diaphragm 15 is positioned between the collimator lens 13a and the focus lens 13b and is positioned along the optical path of the parallel beam of the illumination light L10. For example, the diaphragm 15 is positioned between the optical diffuser 14 and the focus lens 13b. In this example, the diaphragm 15 has a ring-shaped aperture.

Thus, the illumination light L10 passing through the optical diffuser 14 will be shaped into a ring by the diaphragm 15. In such a case, the diaphragm 15 is positioned at an appropriate working distance from the object lens 20.

In a modified form of the present example, the diaphragm 15 is positioned between the collimator lens 13a and the optical diffuser 14. In such a case, the illumination light L10 is shaped into the ring shape by the diaphragm 15 and then the phase of the ring-shaped illumination light L10 is changed by the optical diffuser 14.

The diaphragm 15 may also be disposed at any other position in the optical path of the illumination light L10. Thus, the diaphragm 15 is positioned in the optical path of the divergent beam or the convergent beam of the illumination light L10, so that the divergent beam or the convergent beam of the illumination light L10 may also be shaped into a ring by the diaphragm 15.

Figure 2:
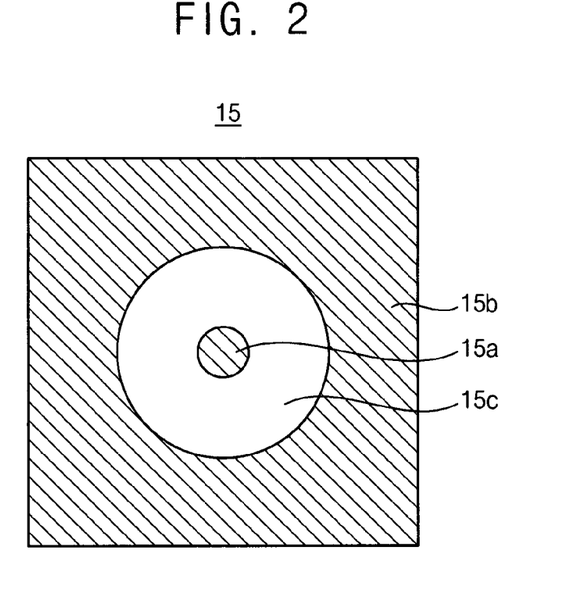
FIG. 2 is a plan view of an example of a ring-shaped aperture of the inspection apparatus shown in FIG. 1 in accordance with the present inventive concept.

FIG. 2 illustrates an example of the ring-shaped aperture of the diaphragm 15 shown in FIG. 1 in accordance with the present inventive concept.

Referring to FIG. 2, the diaphragm 15 may include an inner light shielding unit or section 15a and an outer light shielding unit or section 15b. A circular region (transparent to the illumination light L10) is provided in the outer light shielding unit 15b and the inner light shielding unit 15a is arranged in the circular region of the outer light shielding unit 15b. A ring-shaped aperture 15c is thus delimited by and between the inner light shielding unit 15a and the outer light shielding unit 15b. More particularly, the outer light shielding unit 15b delimits an outer (circular) boundary of the aperture 15c and the inner light shielding unit 15a is smaller than the circular region and is positioned centrally of the outer boundary such that the outer boundary of the aperture 15c and the outer periphery of the inner light shielding unit 15a are concentric. Each of the shielding units or sections 15a, 15b may be referred to simply as a "shield".

Thus, when the illumination light L10 passes through the transparent region of the outer light shielding unit 15b, a central portion of the illumination light L10 is shielded by the inner light shielding unit 15a and the illumination light L10 only may pass through the ring-shaped aperture 15c. Therefore, the illumination light L10 is formed into a ring-shaped light beam by the diaphragm 15.

To this end, the diaphragm 15 may comprise a transparent glass substrate and each of the inner light shielding unit 15a and the outer light shielding unit 15b may include a non-transparent metal layer deposited or sputtered on the transparent glass substrate. The metal layer on the glass substrate may comprise chromium (Cr). Alternatively, the inner light shielding unit 15a and the outer light shielding unit 15b may include a non-transparent mask pattern (material opaque with respect to the illumination light L10) deposited or sputtered on a glass substrate. Furthermore, when the inner light shielding unit 15a and the outer light shielding unit 15b are reflective, as described in detail hereinafter, the inner light shielding unit 15a and the outer light shielding unit 15b may comprise aluminum (Al).

Figure 3:
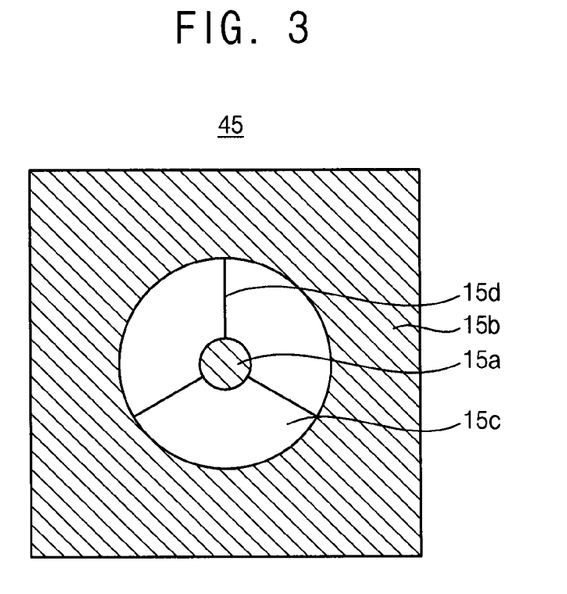
FIG. 3 is a plan view of another example of a ring-shaped aperture of the inspection apparatus shown in FIG. 1 in accordance with the present inventive concept.

FIG. 3 is a plan view of another example of the ring-shaped aperture of the diaphragm 15 shown in FIG. 1 in accordance with the present inventive concept.

Referring to FIG. 3, the diaphragm 45 may include an arm or arms 15d for connecting the inner light shielding unit 15a with the outer light shielding unit 15b across the ring-shaped aperture 15c. In this example, the outer light shielding unit 15b may be a body having a circular hole therethrough and the inner light shielding unit 15a may be a circular body positioned by the arm(s) 15d at the center of the hole in the outer light shielding unit 15b such that the aperture 15c is the ring-shaped or annular portion of the hole defined between the inner light shielding unit 15a and the outer light shielding unit 15b.

In the present example, the field stop 16 is positioned at a focal point of the focus lens 13b. The field stop 16 may be coplanar with an inspection surface 51 of the WUI 50.

The mirror 17 may reflect the illumination light L10 to the beam splitter 19. The illumination light L10 may pass through the field stop 16 and may reach the mirror 17. Then, the illumination light L10 is reflected from the mirror 17 toward the beam splitter 19. To this end, the mirror 17 may be a planar mirror and thus the divergent beam of the illumination light L10 is reflected from the mirror 17 as a divergent beam.

The condenser lens 18 may transform the illumination light L10 reflected from the mirror 17 to a parallel beam and the parallel beam of the illumination light L10 may be incident on the beam splitter 19. In this case, the reflected illumination light L10 from the mirror 17 is incident on the beam splitter 19 as a parallel beam (a beam of parallel rays of light).

Some of the parallel beam is reflected to the object lens 20 by the beam splitter 19. In such a case, the diaphragm 15 and the field stop 16 may be positioned closer to the light source 11 than to the beam splitter 19 along the optical path of the illumination light L10 in the inspection apparatus.

The object lens 20 may focus the illumination light L10 reflected from the beam splitter 19 to the inspection surface 51 of the WUI 50. Because the illumination light L10 is shaped into a ring, the inspection surface 51 of the WUI 50 is illuminated with the ring-shaped illumination light L10. That is, a central portion of a region of the inspection surface 51 of WUI 50 is shadowed and a peripheral portion of the region of the inspection surface 51 of the WUI 50 is illuminated by the ring-shaped illumination light L10 which extends around the shadowed region.

<Structure of the Inspection Apparatus>

Referring again to FIG. 1, the inspection apparatus 1 may include the lighting device 10, an image formation lens 21 and an image sensor 22. The lighting device 10 may include a vertically downward illumination structure.

The illumination light L10 is illuminated downwards and forward onto the inspection surface 51 of the WUI 50. When the illumination light L10 reaches the inspection surface 51, some of the illumination light L10 is reflected and diffracted from the inspection surface 51, to thereby form a backward illumination light L20 propagating towards the object lens 20 again. Thus, the forward illumination light L10 and the backward illumination light L20 propagate in the same space between the object lens 20 and the inspection surface 51 of the WUI 50.

In an example, the backward illumination light L20 may include fluorescent light reflected or diffracted from the inspection surface 51.

Because the backward illumination light L20 is reflected or diffracted from the inspection surface 51, in the present example the backward illumination light L20 passes into the object lens 20 as a divergent beam. Then, the divergent beam of the backward illumination light L20 is formed into a parallel beam by the object lens 20. Thus, the parallel beam of the backward illumination light L20 propagates to the beam splitter 19 through the object lens 20.

Some of the parallel beam of the backward illumination light L20 is transmitted (passes through) the beam splitter 19 and to the image sensor 22 through the image formation lens 21.

The parallel beam of the backward illumination light L20 passing through the beam splitter 19 is focused onto the image sensor 22 by the image formation lens 21.

An image of the inspection surface 51 is generated by the image sensor 22 from the focused beam of the backward illumination light L20 reaching the image sensor 22. For example, a stage (not shown) onto which the WUI 50 is secured may move in a horizontal plane whose normal vector is parallel with an optical axis CL of the inspection apparatus 1 along which the illumination light L10 propagates, and the backward illumination light L20 is continuously generated as the WUI 50 is being moved by the stage. Thus, the backward illumination light L20 is generated from the entire inspection surface 51 and thus a whole surface image reflecting the entire inspection surface 51 of the WUI 50 is generated by the image sensor 22.

<Operation of the Inspection Apparatus>

Figure 4:
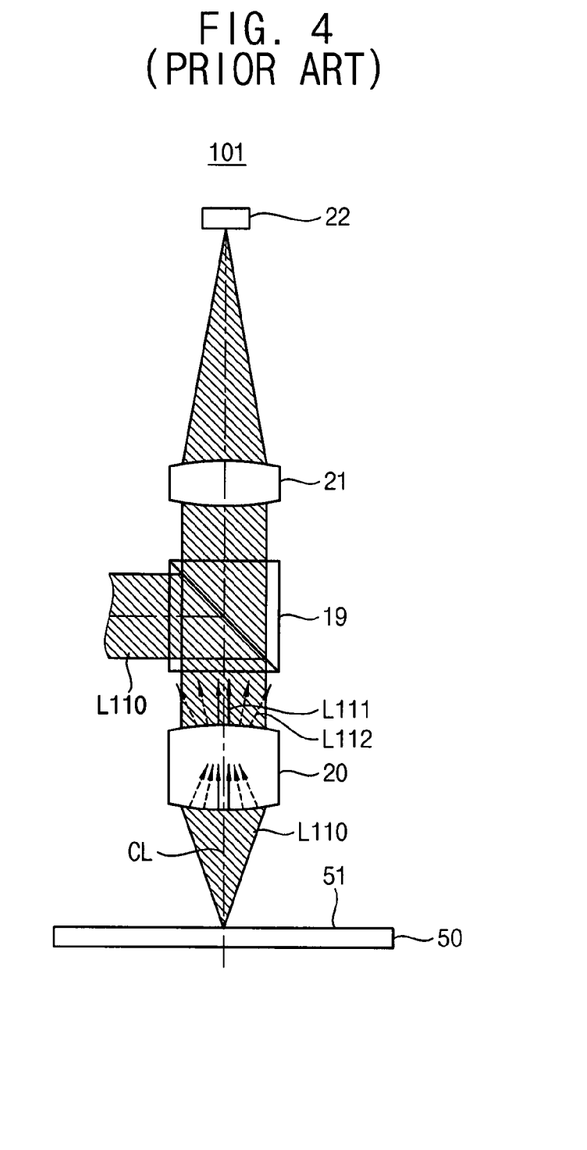
FIG. 4 is a schematic diagram of a conventional inspection apparatus.

Hereinafter, a method of operating the inspection apparatus 1 will be described in detail in comparison with an example of a conventional inspection apparatus 101 shown in FIG. 4.

The conventional inspection apparatus 101 has a structure similar to the example of the inspection apparatus 1 shown in FIG. 1 except that the conventional inspection apparatus 101 lacks the optical diffuser 14 and diaphragm 15. That is, apart from what is shown in FIG. 4, the conventional inspection apparatus 101 includes a light source, optical fiber, collimator lens, focus lens, field stop, mirror, condenser lens, beam splitter and object lens similar to the light source 11, optical fiber 12, collimator lens 13a, focus lens 13b, field stop 16, mirror 17, condenser lens 18, beam splitter 19 and object lens 20, respectively.

Because the conventional inspection apparatus 101 has no ring-shaped aperture, the conventional illumination light L110 incident on the beam splitter 19 does not have an annular cross-sectional shape but a geometrical solid (circular) shape referred to hereinafter as beam-shaped. Some of the conventional illumination light L110 is reflected from the beam splitter 19 to the object lens 20. Thus, the beam-shaped illumination light L110 is illuminated on the inspection surface 51 of the WUI 50 through the object lens 20.

The conventional illumination light L110 is incident on the entire surface of the object lens 20 within the numerical aperture (NA). Thus, although the beam splitter 19 and the object lens 20 may be coated with an anti-reflection layer, reflection light L111 (light reflected from a central portion of the beam splitter 19 and the object lens 20) exhibits lens flare and the flared light propagates to the image sensor 22. Because the flared light may have strong coherence, the flared light easily interferes (undergoes interference) with other flared light and easily interferes with the backward illumination light L20 that is reflected or diffracted from the inspection surface 51. The interference of the flared light may cause speckles and an interference pattern in the image generated by the image sensor 22. The speckles and the interference pattern may not be easily filtered from the image of the image sensor 22. Thus, the image quality of the conventional inspection apparatus 101 is poor, and as a result the inspection accuracy of the conventional inspection apparatus 101 is correspondingly low.

Figure 5:
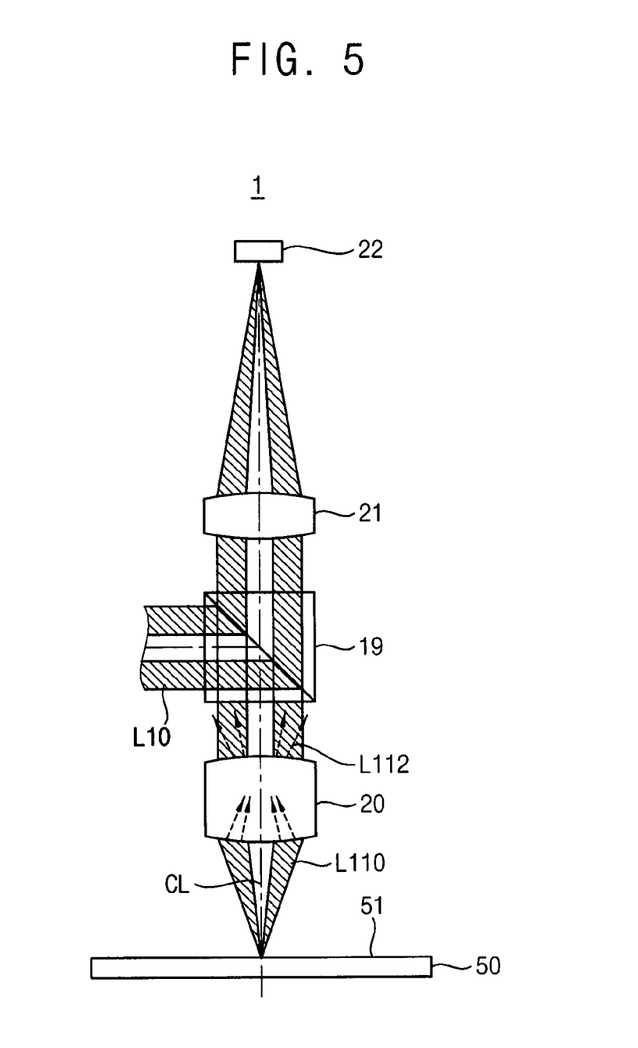
FIG. 5 is a conceptual diagram an inspection process carried out by the inspection apparatus shown in FIG. 1.

FIG. 5 illustrates an inspection process carried out by the inspection apparatus shown in FIG. 1. In FIG. 5, the light source 11, the fiber 12, the collimator lens 13a, the focus lens 13b, the optical phase modulator in the form of a diffuser 14, the diaphragm 15, the field stop 16, the mirror 17 and the condenser lens 18 are not illustrated for convenience' sake.

Referring to FIG. 5, in the inspection process, the ring-shaped illumination light L10 is incident on the beam splitter 19. Some of the ring-shaped illumination light L10 is reflected from the beam splitter 19 onto the object lens 20. Thus, the ring-shaped illumination light L10 illuminates the inspection surface 51 of the WUI 50 through the object lens 20.

Because the illumination light L10 has a ring-shaped or annular cross section (perpendicular to its optical path or optical axis of the object lens 20), no illumination light L10 is incident on the central portion of the object lens 20. Thus, none of the illumination light L10 is reflected from the central portion of the beam splitter 19 and the object lens 20; accordingly, no central reflection light like the reflection light L111 in the conventional inspection apparatus 101 shown in FIG. 4 is generated and no flared light is generated in the inspection apparatus 1. Because speckles and interference pattern in the image are mainly caused by flared light, the images generated by the image sensor 20 are low in terms of speckles and interference pattern exhibited, and the inspection accuracy of the inspection apparatus 1 is correspondingly high. Furthermore, a reduction of speckles and interference pattern may be accomplished by just retrofitting a conventional inspection apparatus 101 with the diaphragm 15, i.e., at a small cost with respect to existing equipment. Thus, the speckles and interference pattern may be sufficiently reduced at low cost.

Figure 6:
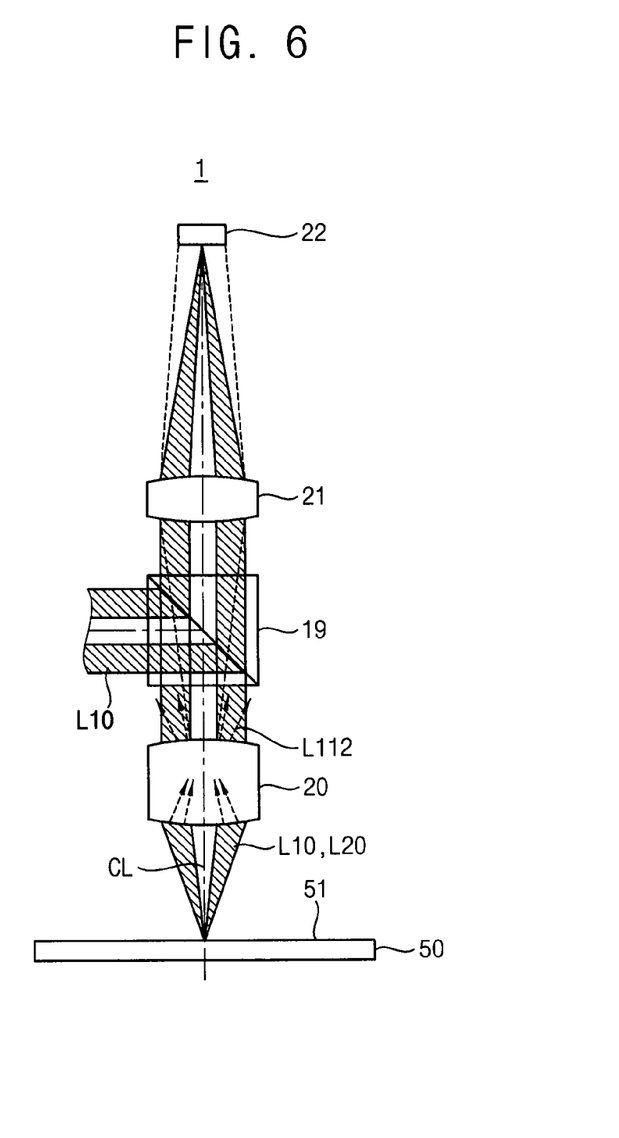
FIG. 6 is a conceptual diagram illustrating criteria for determining the size of the ring-shaped aperture of the inspection apparatus shown in FIG. 1.

FIG. 6 illustrates one way of ascertaining criteria for determining the size of the ring-shaped aperture of the inspection apparatus shown in FIG. 1.

Referring to FIG. 6, the size of the aperture of the diaphragm 15 may be determined by a reverse trace of the light that is incident on the image sensor 22. Because the central reflection light L111 reflected or transmitted from the central portion of the object lens 20 (FIG. 4) exhibits lens flare giving rise to the speckles and the interference pattern in the image, the inner light shielding unit 15a is formed such that no part of the illumination light L10 is incident on or reaches the central portion of the object lens 20 and thus lens flare is not generated in the inspection apparatus 1. That is, the size of the inner light shielding unit 15a is determined such that the illumination light L10 reflected by the object lens 20 will not reach the image sensor 22.

In the same way, because the illumination light L110 reflected from the central portion of the beam splitter 19 (FIG. 4) exhibits lens flare giving rise to the speckles and the interference pattern of the image, the size of the inner light shielding unit 15a is determined such that none of the illumination light L10 is incident on the central portion of the beam splitter 19. (In the present disclosure, as is apparent from the description above, the term "lens flare" will refer to flare in light that is produced as the result of the light being reflected or transmitted by any optical element).

That is, the size and position of the inner light shielding unit 15a in the optical path are determined in such a way that the illumination light L10 is not incident on the central portion of the beam splitter 19 and the object lens 20. Also, the inner light shielding unit 15a is arranged so that it has the same center as, e.g., is concentric with the transparent region of the outer light shielding unit 15b. Thus, a ring-shaped or annular aperture 15c for eliminating lens flare in the inspection apparatus 1 is defined by the diaphragm 15, radially relative to the optical path, between the inner light shielding unit 15a and the outer light shielding unit 15b.

According to the present example of the inspection apparatus 1, the laser beam is provided as the illumination light L10 and the diaphragm 15 is opaque with respect to the central portion of the laser beam and hence, blocks the central portion of the laser beam. Thus, the laser beam is not incident on the central portion of the beam splitter 19 and the object lens 20, thereby preventing or minimizing lens flare. Accordingly, the presence of speckles and of an interference pattern in the image is reduced, thereby improving the image quality of the image sensor and increasing the inspection accuracy of the inspection apparatus 1.

In addition, a laser beam will have a maximal intensity at the central portion thereof because the intensity of the laser beam has a Gaussian distribution radially outwardly from a central portion of the beam in cross section. Thus, the light shielding applied to the central portion of a laser beam in an example of the present inventive concept may remarkably obviate the creation of speckles and interference pattern in an image produced by the image sensor.

Figure 7:
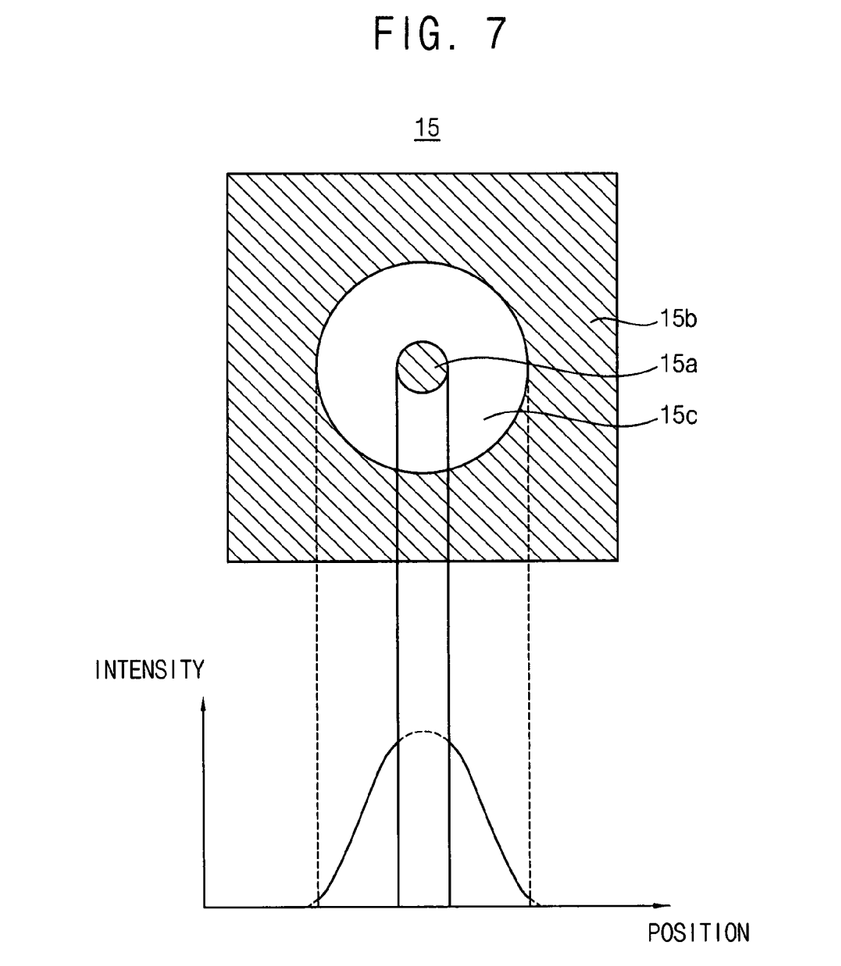
FIG. 7 is a graph showing the light intensity of the illumination light passing through the ring-shaped aperture of the inspection apparatus shown in FIG. 1.

FIG. 7 is a graph showing the light intensity of the illumination light passing through the ring-shaped aperture of the diaphragm 15 of the inspection apparatus shown in FIG. 1. In FIG. 7, the horizontal axis denotes a radial position of the illumination light L10 and the vertical axis denotes an intensity of the illumination light L10.

As shown in FIG. 7, the intensity of the illumination light L10 decreases from the central portion toward the peripheral portion of the beam. Thus, the shielding of the central portion of the illumination light L10 is effective to reduce the speckles and the interference pattern in the image.

In addition, the inspection apparatus 1 has the optical diffuser 14 as well as the diaphragm 15. The phase of the illumination light L10 is normalized by the optical diffuser 14.

Figure 8:
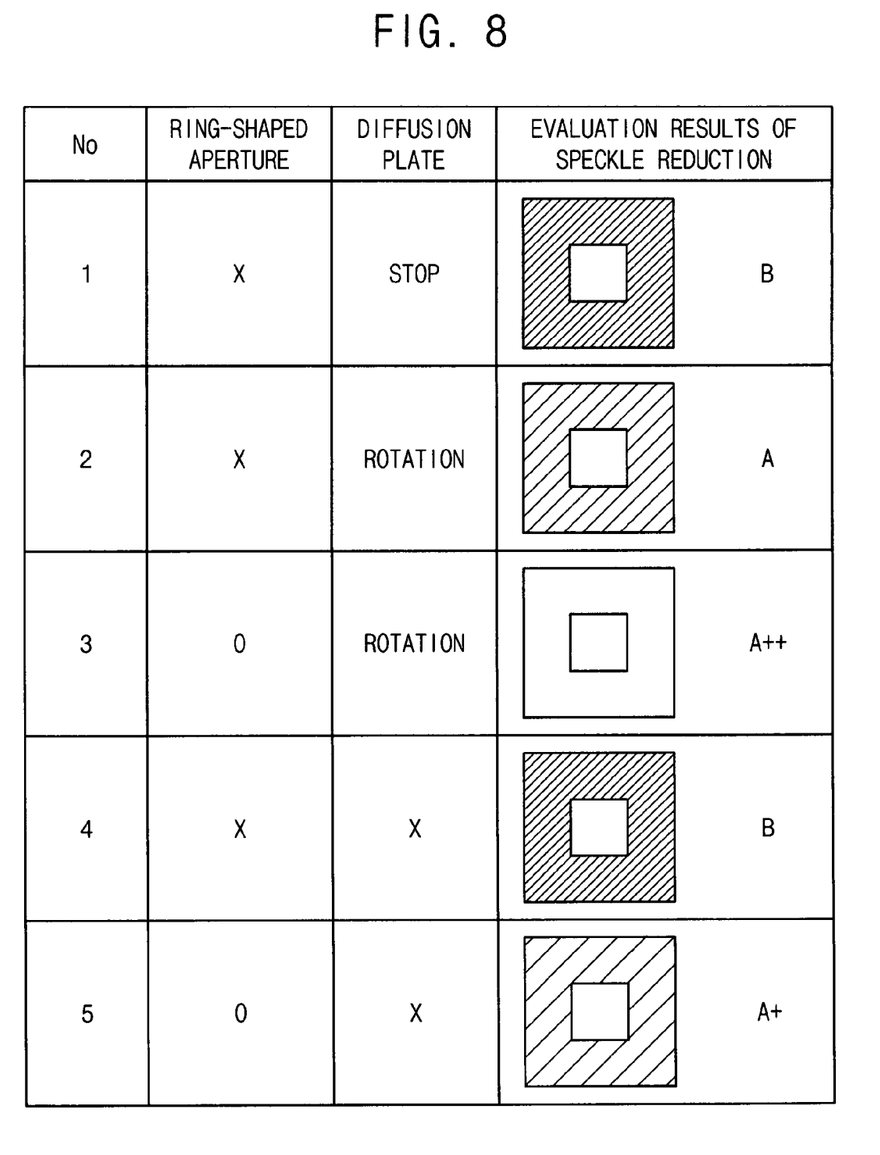
FIG. 8 is a table showing experimental results of relationships between the ring-shaped aperture and/or the diffusion plate and the speckle reduction in the inspection apparatus shown in FIG. 1.

FIG. 8 is a table showing experimental results of the speckle reduction depending on whether the diaphragm 15 and/or the optical diffuser 14 was/were employed in the inspection apparatus shown in FIG. 1. In FIG. 8, the speckles are represented as diagonal lines on a chip image generated by the image sensor of the inspection apparatus and the number of the speckles (corresponding to the density of the lines) relative to a reference number are rated A++, A+, A and B, with A++ being the best rating of speckle reduction (or fewest number of speckles relative to the reference number) and B being the worst.

As shown in FIG. 8, five experiments were conducted and the number of the speckles was detected and evaluated in each experiment. In experiment No. 1, no diaphragm 15 was installed in the inspection apparatus 1 and the optical diffuser 14 was not rotated, i.e., was fixed as a stop. In such a case, the speckles in the chip image were most plentiful and the image was rated a B. In this case, the number of the speckles was much greater than the reference speckle number.

In experiment No. 2, no diaphragm 15 was installed in the inspection apparatus 1 and the optical diffuser 14 was rotated in the inspection apparatus 1. In such a case, fewer speckles were found in the chip image and the image was rated an A. In this case, the number of the speckles was a little bit smaller than the reference speckle number.

In experiment No. 3, the diaphragm 15 was installed in the inspection apparatus 1 and the optical diffuser 14 was rotated in the inspection apparatus 1. In such a case, hardly any speckles were found in the chip image and accordingly, the image was rated an A++. In this case, the number of the speckles was much smaller than the reference speckle number. The experimental results show that the diaphragm 15 and the optical diffuser 14 are highly effective at preventing the productions of speckles in the image.

In experiment No. 4, no diaphragm 15 was installed in the inspection apparatus 1 and no optical diffuser 14 was installed in the inspection apparatus 1. In such a case, the greatest amount of speckles was found in the chip image and accordingly, the image was rated a B. In this case, the number of the speckles was much greater than the reference speckle number.

In experiment No. 5, the diaphragm 15 was installed in the inspection apparatus 1 and no optical diffuser 14 was installed in the inspection apparatus 1. In such a case, few speckles were found in the chip image and as a result the image was rated an A+. In this case, the number of the speckles was much smaller than the reference speckle number.

According to the experimental results, the diaphragm 15 has a greater effect on speckle reduction compared to any other component of the inspection apparatus 1 and the rotation of the optical diffuser 14 can enhance the prevention of speckles in the image. Therefore, the diaphragm 15 and rotating optical diffuser 14 enhance the image quality of the image sensor and the inspection accuracy of the inspection apparatus 1.

The light shielding to the central portion of the illumination light L10 may prevent or minimize the central reflection of the illuminati light L10 from the central portion of the beam splitter 19 and the object lens 20, so that the flared light is prevented or minimized and thus the speckles and the interference pattern is sufficiently reduced in the image.

Particularly, when a laser beam is used as the illumination light for inspecting the WUI 50, the reduction of the flared light is much more important for improving the image quality of the inspection apparatus 1.

When the backward illumination light L20 having a first amplitude $A_s$ and the flared light having a second amplitude $A_f$ are independent from each other, the intensity of the backward illumination light L20 and the flared light is represented as twice the first amplitude $2A_s$ and twice the second amplitude $2A_f$, respectively.

In such a case, when the backward illumination light L20 and the flared light are incoherent with respect to each other, the light intensity $I_{in}$ on the image sensor 22 is represented by following equation (1).

$$I_{in}=2(A_f+A_s) \qquad (1)$$

However, when the backward illumination light L20 and the flared light are coherent with respect to each other, the light intensity $I_{in}$ on the image sensor 22 is represented by following equation (2).

$$I_{in}=2(A_f+A_s) \qquad (2)$$

Figure 9A:
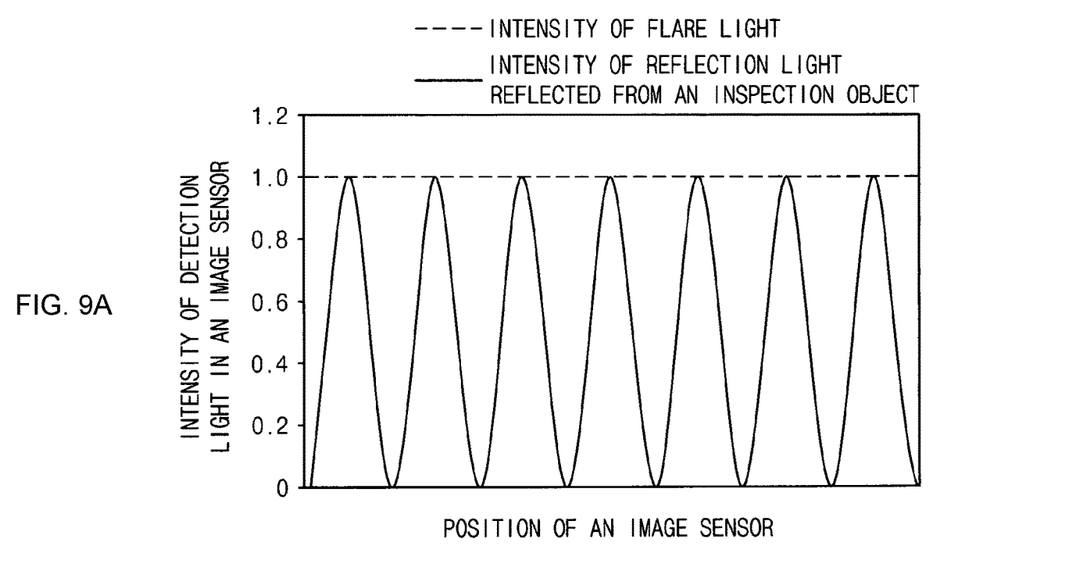
FIG. 9A and FIG. 9B are graphs showing the light intensity on the image sensor of the inspection apparatus shown in FIG. 1, FIG. 9A showing the light intensity when only the backward illumination light or the flared light reaches the image sensor and FIG. 9B showing the light intensity when both of the backward illumination light and the flared light reach the image sensor under coherence condition and incoherence condition.
Figure 9B:
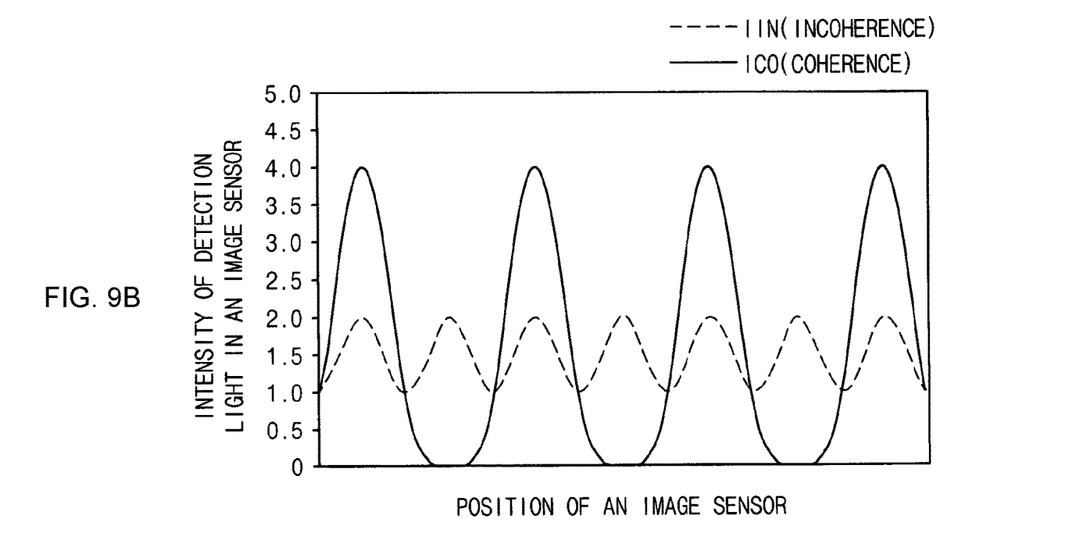

FIG. 9A and FIG. 9B are graphs showing the light intensity on the image sensor of the inspection apparatus shown in FIG. 1 when the backward illumination light L20 or the flared light only reach the image sensor 22 and when both of the backward illumination light L20 and the flared light reach the image sensor 22 under a coherence condition and incoherence condition. The graph of FIG. 9A illustrates the light intensity of the image sensor when the backward illumination light L20 or the flared light only reaches the image sensor 22. In the graph of FIG. 9A, the horizontal axis denotes the position of the image sensor 22 and the vertical axis denotes the light intensity of the image sensor 22. The graph of FIG. 9B illustrates the light intensity of the image sensor when both the backward illumination light L20 and the flared light reach the image sensor 22 under a coherence condition and incoherence condition. In the graph of FIG. 9B, the horizontal axis denotes the position of the image sensor 22 and the vertical axis denotes the light intensity of the image sensor 22.

When the backward illumination light L20 and the flared light have their own intensity distribution on the image sensor 22 as shown in FIG. 9A and simultaneously reach the image sensor 22 under coherence conditions, the intensity of the backward illumination light L20 fluctuates with high amplitude on the image sensor 22 as shown in FIG. 9B. This is because the interference of the scattered light by the speckles in the flared light. When the coherent laser beam is incident on the image sensor as the backward illumination light L20 together with the flared light, the number of the speckles is relatively great and the coherent laser beam is scattered to a large extend by the speckles. Thus, the number of the speckles significantly increases and the intensity of the coherent backward illumination light L20 strongly fluctuates on the image sensor 22, which generates significant speckle noise in the signals output by the image sensor 22.

According to an example of the present inventive inspection apparatus 1, by blocking or shielding the central portion of the laser beam the backward illumination light L20 is a beam of light having an annular or ring-shaped cross section, so that the illumination light L20 transmitted by the beam splitter 19 and the object lens 20 also has an annular or ring-shaped cross section with an umbra at the center of its cross section. Therefore, the flared light is sufficiently minimized or prevented and as a result, the speckles and the interference pattern are significantly reduced.

The diaphragm 15 and the optical diffuser 14 may be positioned in the optical path of the parallel beam of the illumination light L20 or the optical path of the divergent beam or the convergent beam of the illumination light L20. In addition, the diaphragm 15 and the field stop 16 are positioned closer to the light source 11 than to the beam splitter 19 along the optical path of the illumination light L10, thereby improving the design flexibility of the lighting device 10 and the inspection apparatus 1.

The diaphragm 15 may comprise a transparent substrate coated with an opaque or reflective material by an adhering process, a coating process, a deposition process or sputtering process.

The size of the inner light shielding unit 15a is optimally determined in such a way that no light from a central region of the optics of the inspection apparatus, containing the optical path of the light or optical axis/axes of the optics, reaches the image sensor 22. Thus, the WUI 50 is illuminated as much as possible while minimizing or preventing the production of flared light. Hence, the number of speckles and the interference pattern are minimized, thereby enhancing the inspection accuracy of the inspection apparatus 1.

Although the diaphragm 15 has been described as comprising a glass substrate, the diaphragm 15 may be provided in various other ways as long as it provides a ring-shaped or annular aperture, and may be sized according to characteristics of the inspection apparatus 1.

Figure 10:
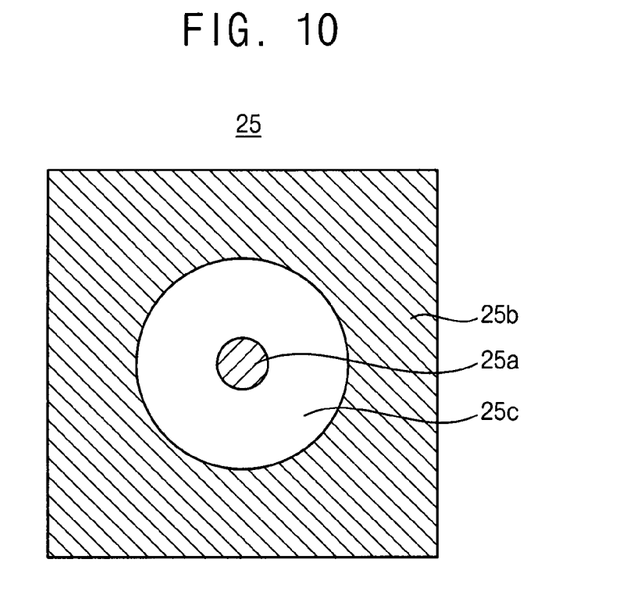
FIG. 10 is a plan view a first example of a modified aperture of the inspection apparatus shown in FIG. 1.

FIG. 10 illustrates a modified diaphragm providing an aperture of the inspection apparatus shown in FIG. 1.

Referring to FIG. 10, diaphragm 25 may include an inner light shielding unit 25a and an outer light shielding unit 25b. The inner light shielding unit 25a is smaller than the outer light shielding unit 25b and is positioned at a central portion of the outer light shielding unit 25b. A ring-shaped or annular aperture 25c is provided between the inner light shielding unit 25a and the outer light shielding unit 25b.

The inner light shielding unit 25a may be or include a reflective member R that reflects the illumination light L10. The light reflected from the reflective member R may propagate to the light source through the optical fiber 12. When the light source 11 includes a laser for generating a laser beam as the illumination light L10, the laser oscillation is obstructed by the reflected light and thus the laser may exhibit a mode hop. .

Mode hopping is a phenomenon in which the laser exhibits changes between its modes of oscillation (resonance) and the phase of laser oscillation changes discontinuously. Therefore, the wavelength and the phase of the illumination light L10 are changed in a mode hop and the coherence of the laser beam is weakened by the mode hop, thereby reducing the speckles in the image of the image sensor 22 especially when the laser is a semiconductor laser having a Fabry-Perot resonator. In the present example, the laser beam may have a plurality of vertical modes.

Figure 11:
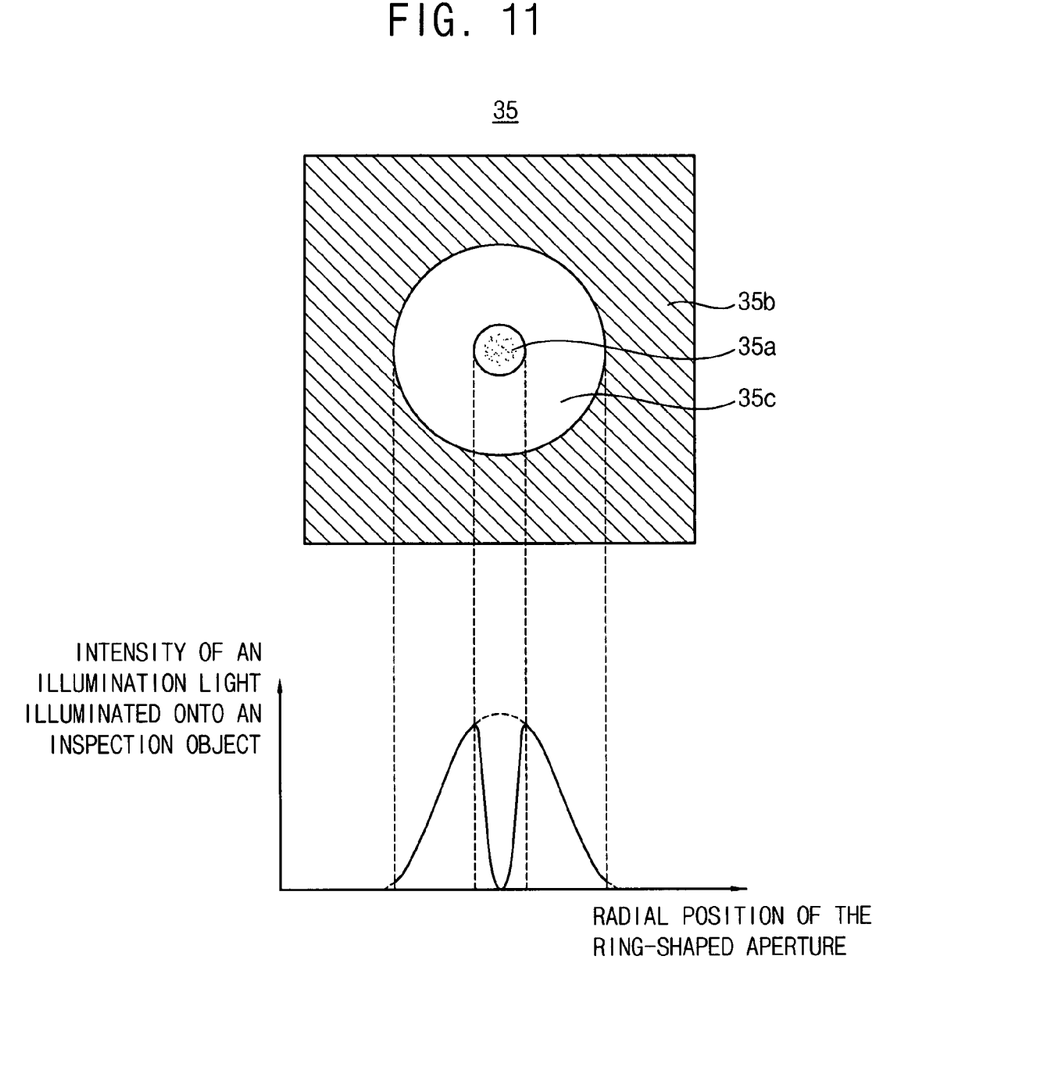
FIG. 11 is a plan view of a second example of a modified aperture of the inspection apparatus shown in FIG. 1.

FIG. 11 illustrates another example of a modified aperture of the inspection apparatus shown in FIG. 1. In FIG. 11, the plan view of a diaphragm 35 providing an aperture is shown together with the intensity variation of the illumination light L10 passing through the diaphragm diametrically across the aperture.

Referring to FIG. 11, the diaphragm 35 may include an inner light shielding unit 35a and an outer light shielding unit 35b. The inner light shielding unit 35a is smaller than and is positioned centrally with respect to the outer light shielding unit 35b. Thus, a ring-shaped transparent region 35c is provided between the inner light shielding unit 35a and the outer light shielding unit 35b. The inner light shielding unit 35a may be semi-transparent with respect to the illumination light L10.

In particular, the inner light shielding unit 35a may have light shielding characteristics that gradually decrease from its center to its outer periphery. Thus, the illumination light L10 may maximally shielded at the central portion of the inner light shielding unit 35a and may be minimally shielded (partially blocked) at the peripheral portion of the inner light shielding unit 35a. Thus, the central portion of the illumination light L10 strongly associated with the generation of the flared light and the speckles is maximally shielded or blocked completely and the rest of the illumination light L10 is transmitted by the diaphragm 35 through its aperture, whereby the WUI 50 may be illuminated with illumination light L10 of a fairly high intensity while still preventing speckles and an interference pattern from being produced in the image generated by the image sensor 22.

In addition, a reflective member that reflects some light and transmits the rest may also be arranged on the inner light shielding unit 35a. In this case, the reflectivity may also gradually decrease from the central portion to the peripheral portion. Thus, a maximum amount of some of the illumination light L10 may be reflected from the reflection member R at the central portion of the inner light shielding unit 35a and a smaller amount of some of the light may be reflected from the reflection member R at the peripheral portion of the inner light shielding unit 35a.

According to an aspect of the present inventive concept as described in detail above, the illumination light L10 is transformed by an aperture such that substantially no illumination light is incident on the central portion of the beam splitter 19 and the object lens 20. Thus, substantially none of the illumination light is reflected from the central portion of the beam splitter 19 and the object lens 20, whereby lens flare is prevented in the optics of the inspection apparatus 1.

According to another aspect of the present inventive concept as described in detail above, the illumination light L10 is transformed by an aperture such that an umbra is cast on the central portion of the beam splitter 19 and the object lens 20, i.e., relatively little or none of the illumination light L10 is incident on the central portion of the beam splitter 19 and the object lens 20. Thus, a central part of illumination light having a relatively small luminance compared to the peripheral part of the illumination light is reflected or transmitted if at all from the central portion of the beam splitter 19 and the object lens 20, whereby lens flare is mitigated in the optics of the inspection apparatus 1.

Because lens flare may produce speckles and an interference pattern, the images generated by the image sensor 20 may have relatively few speckles and hardly exhibit any interference pattern, whereby the accuracy of the inspection apparatus 1 is enhanced. Furthermore, the reduction of the speckles and the interference pattern may be accomplished just by installing the aperture in a conventional inspection apparatus 101, i.e., at little cost.

The foregoing examples are illustrative of and not to be construed as limiting with respect to the present inventive concept. Also, those skilled in the art will readily appreciate that many modifications of and changes to the examples are possible without materially departing from the novel aspects and advantages of the present inventive concept. Accordingly, all such modifications and changes are intended to be included within the scope of the present inventive concept as defined in the claims.

What is claimed is:

1. A lighting device comprising:
    a light source that generates illumination light along an optical path of the lighting device;
    a ring-shaped aperture disposed along the optical path such that a central portion of the illumination light is shielded and the illumination light transmitted through the ring-shaped aperture has a ring-shaped cross section in a plane perpendicular to the optical path; and an object lens positioned downstream of the ring-shaped aperture along the optical path to focus the illumination light having the ring-shaped cross section on a focal plane onto a specimen disposed at the focal plane, wherein:
the ring-shaped aperture is defined between an inner light shield and an outer light shield delimiting an outer boundary of the ring-shaped aperture, the inner light shield being arranged centrally with respect to the outer boundary of the ring-shaped aperture delimited by the outer light shield, and
transmittance of the inner light shield, with respect to the illumination light, decreases from a central portion to a peripheral portion thereof.

2. The lighting device of claim 1, further comprising an optical phase modulator disposed along the optical path and operative to change a phase of the illumination light temporally or spatially.

3. The lighting device of claim 2, wherein the optical phase modulator comprises an optical diffuser whose position relative to the optical path is variable over time.

4. The lighting device of claim 1, further comprising:
optics configured to transmit the illumination light as a parallel beam, a divergent beam and a convergent beam along respective portions of the optical path, wherein
the ring-shaped aperture is positioned in a the portion of the optical path along which the parallel beam of the illumination light transmitted.

5. The lighting device of claim 1, wherein the ring-shaped aperture is positioned between the light source and the object lens.

6. The lighting device of claim 1, further comprising:
optics configured to transmit the illumination light as a parallel beam, a divergent beam and a convergent beam along respective portions of the optical path, wherein
the ring-shaped aperture is positioned in a portion of the optical path along which the divergent beam or the convergent beam is transmitted.

7. The lighting device of claim 1, further comprising a reflective member on the inner light shield.

8. The lighting device of claim 7, wherein the reflective member has a reflectance that decreases from a central portion to a peripheral portion of the inner light shield.

9. The lighting device claim 1, wherein the light source comprises a laser.

10. The lighting device claim 9, wherein the laser is a semiconductor laser that has a Fabry-Perot resonator.

11. An inspection apparatus comprising:
a light source that generates illumination light along an optical path;
a ring-shaped aperture disposed along the optical path such that a central portion of the illumination light is shielded and the illumination light transmitted through the ring-shaped aperture has a ring-shaped cross section in a plane perpendicular to the optical path;
an object lens positioned downstream of the ring-shaped aperture along the optical path to focus the illumination light having the ring-shaped cross section on a focal plane to a specimen disposed at the focal plane such that a central portion of the illumination light generated by the light source is not to be reflected from the specimen; and
an image sensor positioned relative to the object lens to receive a peripheral portion of the illumination light reflected from the specimen and operative to generate an image of the specimen from the illumination light reflected from the specimen, wherein:
the ring-shaped aperture is defined between an inner light shield and an outer light shield delimiting an outer boundary of the ring-shaped aperture, the inner light shield being arranged centrally with respect to the outer boundary of the ring-shaped aperture delimited by the outer light shield, and
transmittance of the inner light shield, with respect to the illumination light, decreases from a central portion to a peripheral portion thereof.

12. The inspection apparatus of claim 11, wherein a reflective member on the inner light shield has a reflectance that decreases from a central portion to a peripheral portion of the inner light shield.

13. An inspection apparatus comprising:
a light source that generates illumination light along an optical path;
a diaphragm disposed along the optical path, the diaphragm including an outer light shield delimiting an outer boundary of an aperture and an inner light shield disposed centrally with respect to the outer boundary of the aperture such that the diaphragm transmits the illumination light through the aperture as a beam with an umbra at a central portion of the beam;
an object lens positioned downstream of the aperture along the optical path to focus the beam with an umbra at its central portion on a focal plane, whereby a peripheral portion of the beam focused by the object lens is to illuminate and reflect from a specimen disposed at the focal plane; and
an image sensor positioned relative to the object lens to receive the beam of illumination light reflected from the specimen and operative to generate an image of the specimen from the beam of the illumination light reflected from the specimen wherein
the inner light shield is partially transparent with respect to the illumination light generated by the light source and has a transmittance that decreases from a central portion to a peripheral portion thereof.

14. The inspection apparatus of claim 13, wherein the inner light shield is opaque with respect to the illumination light generated by the light source.

15. The inspection apparatus of claim 13, wherein the light source comprises a laser that generates a laser beam as the illumination light.

16. The inspection apparatus of claim 15, wherein the inner light shield comprises a member or coating that is reflective.

17. The inspection apparatus of claim 15, further comprising an optical phase modulator disposed along the optical path between the laser of the light source and the aperture.

18. The inspection apparatus of claim 16, wherein the member or coating has a reflectance that decreases from a central portion to a peripheral portion of the inner light shield.

* * * * *